(12) United States Patent
Ikeda et al.

(10) Patent No.: US 7,049,624 B2
(45) Date of Patent: May 23, 2006

(54) MEMBER AND MEMBER MANUFACTURING METHOD

(75) Inventors: Hajime Ikeda, Kanagawa (JP);
Nobuhiko Sato, Kanagawa (JP);
Kiyofumi Sakaguchi, Kanagawa (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/838,269

(22) Filed: May 5, 2004

(65) Prior Publication Data
US 2004/0224489 A1    Nov. 11, 2004

(30) Foreign Application Priority Data
May 6, 2003    (JP)    ............... 2003-128229

(51) Int. Cl.
*H01L 47/00*    (2006.01)
(52) U.S. Cl. ............... 257/3; 257/48; 438/445; 438/456; 438/457; 438/458; 438/459; 438/14
(58) Field of Classification Search ............... None
See application file for complete search history.

(56) References Cited

U.S. PATENT DOCUMENTS

| | | | |
|---|---|---|---|
| 5,371,037 A | 12/1994 | Yonehara | |
| 5,854,123 A * | 12/1998 | Sato et al. ............... | 438/507 |
| 5,856,229 A | 1/1999 | Sakaguchi et al. ............... | 438/406 |
| 6,150,031 A | 11/2000 | Yonehara ............... | 428/446 |
| 2001/0019153 A1 * | 9/2001 | Sato et al. ............... | 257/347 |
| 2002/0016167 A1 * | 2/2002 | Fossati et al. ............... | 455/423 |
| 2003/0190794 A1 | 10/2003 | Ohmi et al. ............... | 438/458 |

FOREIGN PATENT DOCUMENTS

| | | |
|---|---|---|
| JP | 05-21338 | 1/1993 |
| JP | 05-21371 | 1/1993 |
| JP | 7-45573 | 2/1995 |
| JP | 08-306682 | 11/1996 |

OTHER PUBLICATIONS

St. Frohnhoff et al., "Formation Techniques for Porous Silicon Superlattices", Thin Solid Films, vol. 255 (1995), pp. 59-62.

* cited by examiner

*Primary Examiner*—Dung A. Le
(74) *Attorney, Agent, or Firm*—Fitzpatrick, Cella, Harper & Scinto

(57) ABSTRACT

A porous structure with high uniformity is provided even when evaluated at a high resolution (high evaluation standard) of several or several ten nm or less. By applying this porous structure to the manufacture of an SOI substrate, an SOI substrate which has an SOI layer with a small number of defects is provided. In a region at a depth of 5 to 10 nm from the surface of a porous Si layer, values of parameters such as porosity and the like which represent a porous structure are uniformed. The manufacture of an SOI substrate using this porous Si layer reduces recessed defects in an SOI layer.

6 Claims, 11 Drawing Sheets

|  | Rms[nm] | P-V[nm] | NUMBER OF DEFECTS |
|---|---|---|---|
| WITH ANNEALING | 5.66 | 26.50 | 10000~20000 |
| WITHOUT ANNEALING | 11.89 | 50.50 | 200~1000 |

FIG. 9

| NAME | DEPTH [nm] | DENSITY OF PORES [UNIT/cm$^2$] | POROSITY [%] | MEAN SIZE [nm] | WALL THICKNESS [nm] |
|---|---|---|---|---|---|
| LOW-POROSITY LAYER | 0~8 | $2.0 \times 10^{11}$ | 15.4 | 9.5 | 14.3 |
| STANDARD POROSITY LAYER | 8~ | $1.7 \times 10^{11}$ | 15.4 | 9.8 | 14.3 |

F I G. 10

| NAME | DEPTH [nm] | DENSITY OF PORES [UNIT/cm²] | POROSITY [%] | MEAN SIZE [nm] | WALL THICKNESS [nm] |
|---|---|---|---|---|---|
| ROUGHNESS LAYER | 0~12 | $4.4 \times 10^{11}$ | 31.8 | 8.8 | 6.7 |
| LOW-POROSITY LAYER | 12~35 | $7.6 \times 10^{10}$ | 5.8 | 9.5 | 32.6 |
| STANDARD POROSITY LAYER | 35~ | $2.1 \times 10^{11}$ | 18.7 | 9.3 | 14.6 |
| LOW-POROSITY LAYER / STANDARD POROSITY LAYER | | 0.37 | 0.31 | 1.02 | 2.24 |

FIG. 11

MEMBER AND MEMBER MANUFACTURING METHOD

FIELD OF THE INVENTION

The present invention relates to a member which includes a porous region, and a member manufacturing method of forming a porous region at the final stage or intermediate stage.

BACKGROUND OF THE INVENTION

Application fields of porous silicon as a porous member include, e.g., the manufacture of an SOI (Silicon On Insulator or Semiconductor On Insulator) substrate. For example, Japanese Patent Laid-Open No. 5-21338 discloses a method of manufacturing an SOI substrate using porous silicon. In the SOI substrate manufacturing method disclosed in Japanese Patent Laid-Open No. 5-21338, a nonporous Si layer (a layer to eventually serve as an SOI layer) is formed on a porous Si layer, and the first substrate including the nonporous Si layer is bonded to the second substrate such that an insulator is located on the nonporous Si layer. Then, a portion from the back surface of the first substrate to porous silicon is removed from the bonded substrate stack, thereby obtaining an SOI substrate having the nonporous Si layer on a buried insulating layer.

Japanese Patent Laid-Open No. 5-21338 does not consider a porous structure in a region (e.g., a region from the surface to a depth of 100 nm) in the vicinity of the surface of the porous Si layer formed in the porous Si layer formation step.

Recently, demands have arisen for a thinner SOI layer as an active layer of an SOI substrate. The present inventors have found that the structure of a region in the vicinity of the surface of a porous Si layer to serve as an underlying layer for an SOI layer is extremely important in thinning the SOI layer. As will be described later in detail, the present inventors also have found that the surface layer of a substrate on which a porous Si layer is to be formed, having a hydrogen concentration higher than that of the remaining portion, affects the structure of the porous Si layer to be formed.

As prior-art references that pertain to adverse effects produced by diffusion of hydrogen in an Si substrate without a porous Si region, i.e., a general Si substrate and measures against them, there are available Japanese Patent Laid-Open Nos. 7-45573 and 5-21371. Japanese Patent Laid-Open Nos. 7-45573 and 5-21371, however, have nothing to do with application technology of porous silicon and, more particularly, a technique for processing a material substrate to form a thin high-quality nonporous layer on a porous Si layer.

SUMMARY OF THE INVENTION

The present invention has been made on the basis of the above-mentioned findings by the present inventors, and has as its object to provide a porous structure which exhibits high uniformity even when evaluated at a high resolution (high evaluation standard) of not more than several nm or several ten nm or provide a technique for manufacturing a high-quality member (e.g., an SOI substrate) using the same porous structure.

The present invention has various aspects. Some aspects of the present invention will be illustrated below.

According to the first aspect of the present invention, there is provided a member which includes a porous region, characterized in that in a region at a depth within a range from 5 to 100 nm from a surface of the porous region made of silicon, a thickness of a porous wall between pores, a density of pores, and a porosity are substantially uniform.

According to the second aspect of the present invention, there is provided a member which includes a porous region, characterized in that in a region at a depth within a range from 5 to 100 nm from a surface of the porous region made of silicon, a thickness of a porous wall between pores, a density of pores, and a porosity vary to have values half to twice corresponding reference values.

According to the third aspect of the present invention, there is provided a member which includes a porous region, characterized in that if evaluation is performed at an arbitrary depth within a range from 5 to 100 nm from a surface of the porous region, a mean of thicknesses of porous walls between pores at a predetermined depth within the range is half to twice a mean of thicknesses of porous walls between pores at a depth of not less than 100 nm from the surface of the porous region.

According to the fourth aspect of the present invention, there is provided a member which includes a porous region, characterized in that if evaluation is performed at an arbitrary depth within a range from 5 to 100 nm from a surface of the porous region, a porosity at a predetermined depth within the range is half to twice a porosity at a depth of not less than 100 nm from the surface of the porous region.

According to the fifth aspect of the present invention, there is provided a member which includes a porous region, characterized in that if evaluation is performed at an arbitrary depth within a range from 5 to 100 nm from a surface of the porous region, a density of pores at a predetermined depth within the range is half to twice a density of pores at a depth of not less than 100 nm from the surface of the porous region.

According to the sixth aspect of the present invention, there is provided a member which includes a porous region, characterized in that the member is obtained by making a resistivity of a region from a surface of a material member to a depth of 100 nm substantially uniform in a direction of depth and then anodizing the member.

According to the seventh aspect of the present invention, there is provided a member which includes a porous region, characterized in that the member is obtained by making a resistivity in a vicinity of a surface of a material member substantially uniform in a direction of depth and then anodizing the member.

The characteristic members illustrated as the first to seventh aspects provide a porous region with high uniformity even when evaluated at a resolution not heretofore considered, i.e., a high resolution (high evaluation standard) of not more than several nm or several ten nm.

The present invention, which has been exemplified as the first to fifth aspects, is particularly advantageous in an application in which the porous region contains silicon.

The present invention, which has been exemplified as the sixth and seventh aspects, is particularly advantageous in an application which uses a material member containing silicon as the material member.

According to the eighth aspect of the present invention, there is provided a method of manufacturing a member, characterized by comprising an adjustment step of adjusting a resistivity in a vicinity of a surface of a material, and a porosification step of porosifying the material from the surface of the material to a deep portion by anodizing to form a porous region. Forming a porous region after adjusting the resistivity in the vicinity of the surface of the material can, e.g., control the structure of the porous region to be formed.

According to a preferred embodiment of the present invention, the adjustment step can be performed such that a resistivity of a region from the surface of the material to a depth of 100 nm is substantially uniform in a direction of depth.

Alternatively, the adjustment step can be performed such that the resistivity in the vicinity of the surface of the material is substantially uniform in a direction of depth.

Alternatively, the adjustment step can be performed such that the resistivity in the vicinity of the surface of the material decreases.

Alternatively, the adjustment step can comprise a step of annealing the material. The annealing step preferably comprises a step of annealing the material at not less than 50° C. in an oxygen-containing atmosphere. Alternatively, the annealing step preferably comprises a step of annealing the material at 50° C. to less than 1,100° C. in a rare gas atmosphere. Alternatively, the annealing step preferably comprises a step of annealing the material in clean air.

The manufacturing method according to the eighth aspect of the present invention is particularly advantageous in the following application. That is, the manufacturing method according to the eighth aspect of the present invention preferably further comprises a growth step of growing at least one layer including a semiconductor layer on the porous region. The manufacturing method preferably further comprises a bonding step of bonding a second member to a surface of a member on which the at least one layer is formed to form a bonded member stack after the growth step. The manufacturing method preferably further comprises a removal step of removing a portion from an exposed surface of the member in the bonded member stack to the porous region after the bonding step.

At least one layer preferably includes an insulating layer formed subsequently to formation of the semiconductor layer. Alternatively, at least a surface of the second member may be made of an insulator. In these cases, an SOI substrate which has a semiconductor layer on a buried insulating layer can be obtained through the manufacturing method. This application to the manufacture of an SOI substrate makes it possible to provide an SOI layer which has a thickness of, e.g., 100 nm or less, and more preferably, several ten nm or less and has very few defects.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments according to the present invention and their advantages will be described with reference to the accompanying drawings.

A method of manufacturing an SOI substrate as a preferred application of a porous structure according to the present invention will be described with reference to FIGS. 1A to 1F.

Figure 1A:
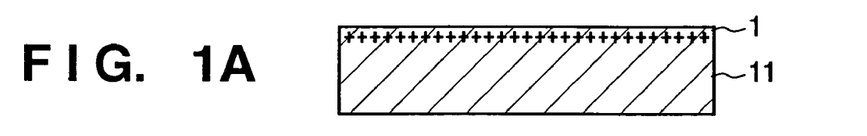
FIGS. 1A to 1F show a method of manufacturing an SOI substrate according to a preferred embodiment of the present invention.

In the annealing step shown in FIG. 1A, a silicon substrate such as a p-type single-crystal Si substrate (seed substrate) 11 serving as a material substrate is annealed. This annealing causes the resistivity of the vicinity of the surface (e.g., a region from the surface to a depth of about 100 nm) of the Si substrate 11 to substantially coincide with that of a deep portion (e.g., a portion at a depth of 100 nm or more from the surface). A general p-type single-crystal Si substrate has higher resistivity in the vicinity of the surface than at the deep portion. This is because an undesirable diffused impurity such as hydrogen 1 is present in the vicinity of the surface. The annealing can be performed such that the hydrogen 1 in the vicinity of the surface can be released outside the Si substrate 11. This step will be described later in detail.

Figure 1B:
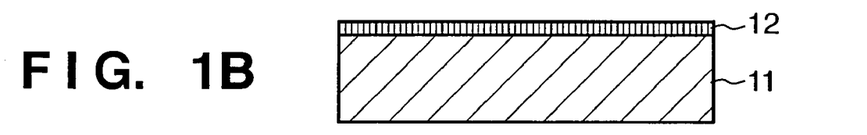

In the anodizing step shown in FIG. 1B, the surface of the Si substrate 11 is made porous to form a porous Si layer 12. The anodizing step includes, e.g., a step of filling a space between a pair of electrodes with an anodizing solution such as a solution containing HF (hydrogen fluoride), arranging a substrate to be processed (i.e., the Si substrate 11) between the pair of electrodes, and supplying a current between the electrodes.

Annealing the Si substrate 11 prior to the anodizing step, as described above, makes it possible to cause a porous structure in the vicinity of the surface (e.g., a region at a depth of 10 nm to 100 nm from the surface) of the porous Si layer 12 to be formed to substantially coincide with that at a deeper portion (e.g., a region at a depth of more than 100 nm from the surface) or obtain an allowable porous structure both in the vicinity of the surface and at the deep portion. An allowable porous structure means a structure from which an SOI layer with a desired thickness can eventually be obtained. The porous structure in the vicinity of the surface can affect the structure and planarity of a nonporous Si layer (to eventually serve as an SOI layer) to be formed thereon.

Figure 1C:
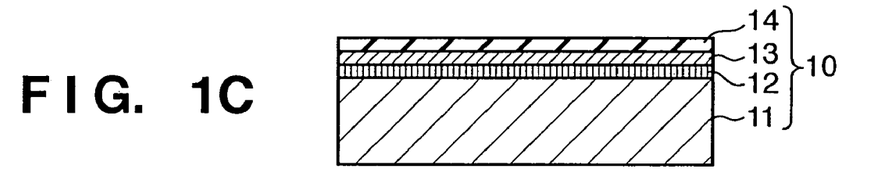

In the growth step shown in FIG. 1C, a nonporous semiconductor layer such as a nonporous single-crystal Si layer (SOI layer) 13 is grown on the porous Si layer 12. The nonporous single-crystal Si layer 13 is typically formed by epitaxial growth. Subsequent to the formation of the nonporous single-crystal Si layer 13, an insulating layer such as a silicon oxide insulating layer (buried insulating layer) 14 is preferably formed on the nonporous single-crystal Si layer 13. The silicon oxide insulating layer 14 can be formed by, e.g., oxidizing the surface of the nonporous single-crystal Si layer 13 by thermal oxidation.

Figure 1D:
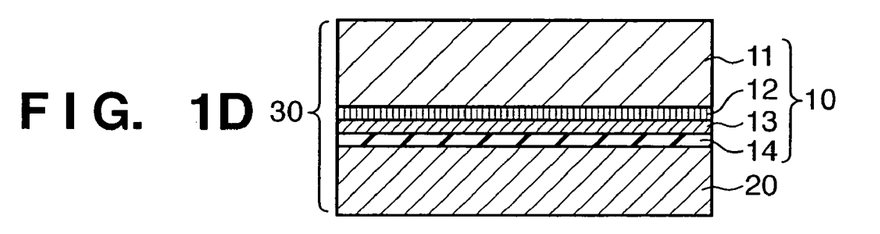

In the bonding step shown in FIG. 1D, a second substrate (handle substrate) 20 is bonded to the silicon oxide insulating layer 14 side of a first substrate 10 formed in the growth step shown in FIG. 1C to form a bonded substrate stack 30. As the second substrate 20, e.g., an Si substrate, Si substrate having an insulating layer on its surface, or insulating substrate such as a glass substrate can be adopted. If the silicon oxide insulating layer 14 is not formed in the growth step, a substrate having an insulator at least on its surface can be adopted as the second substrate 20.

Figure 1E:
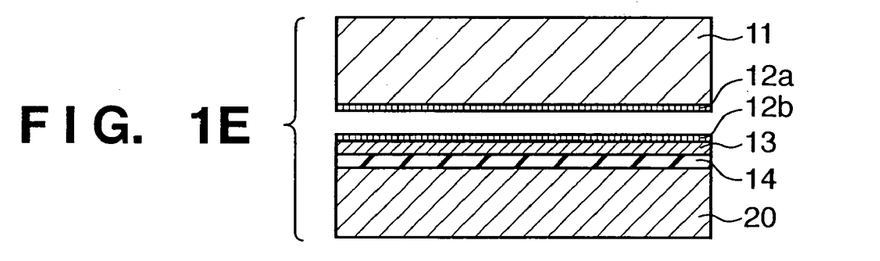

In the division step shown in FIG. 1E, the bonded substrate stack 30 is divided into two substrates at the porous Si layer 12. At this time, the bonded substrate stack 30 can be divided at the periphery of the porous Si layer 12 or at the interface between the porous Si layer 12 and either of the two adjacent layers. With this operation, a portion from the back surface to the porous Si layer 12 is removed from the first substrate 10 constituting part of the bonded substrate stack 30. The division step can be performed by injecting a fluid to the porous Si layer 12 or its vicinity while rotating the bonded substrate stack 30. Such a method is an application of a wafer jet method. In place of the division step, a portion from the back surface to the porous Si layer 12 may be removed from the first substrate 10 constituting part of the bonded substrate stack 30 by etching, polishing, or the like.

Figure 1F:
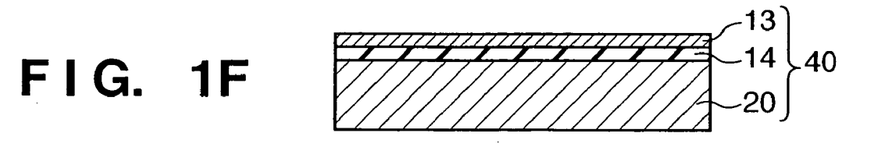

In the post-process step shown in FIG. 1F, the surface of the second substrate 20 having undergone the division step shown in FIG. 1E is subjected to the etching step and/or the surface planarization step (e.g., the polishing step or annealing step), thereby obtaining an SOI substrate 40 which has the nonporous single-crystal Si layer 13 having a desired thickness and desired surface planarity. The nonporous single-crystal Si layer 13 is an SOI layer arranged on the silicon oxide insulating layer 14.

The annealing step shown in FIG. 1A and its advantages will be described below.

A porous Si layer is formed on a commercially available p-type single-crystal Si substrate without annealing (FIG. 1B). The substrate is then subjected to the growth step (FIG. 1C), bonding step (FIG. 1D), and division step or removal step (FIG. 1E). In the post-process step (FIG. 1F), a residual porous Si layer 12b is removed to obtain an SOI substrate.

The surface of the SOI substrate can have projections and recesses which have a height difference of, e.g., 30 nm to 50 nm.

These recesses serve as recessed defects of the SOI layer. If the recesses are deep enough to reach the second substrate (handle substrate) 20, they become pinholes to cause HF defects in the SOI layer 13. An HF defect can be caused by processing an SOI substrate with an HF (hydrogen fluoride) solution.

The present inventors have found that a low-porosity layer formed in the vicinity of the porous Si layer 12 causes a recess such as a pinhole as described above. A low-porosity layer formed in the vicinity of the surface of the porous Si layer and a process in which excessive projections and recesses are formed in the surface of the SOI substrate due to the low-porosity layer will be described below with reference to FIGS. 2A to 2C.

Figure 2A:
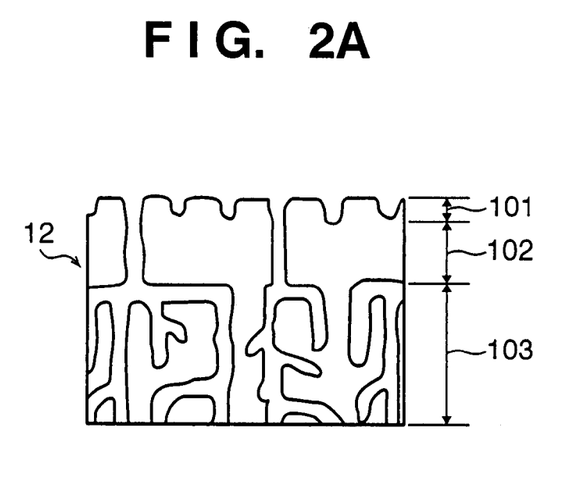
FIGS. 2A to 2C illustrate a low-porosity layer formed in the vicinity of the surface of a porous Si layer and a process in which projections and recesses are formed at an interface between the porous Si layer and a nonporous Si layer to be formed thereon due to the low-porosity layer.
Figure 2B:
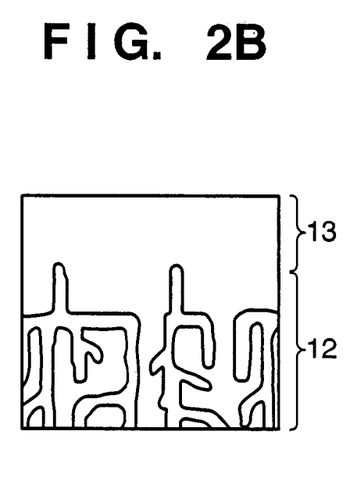
Figure 2C:
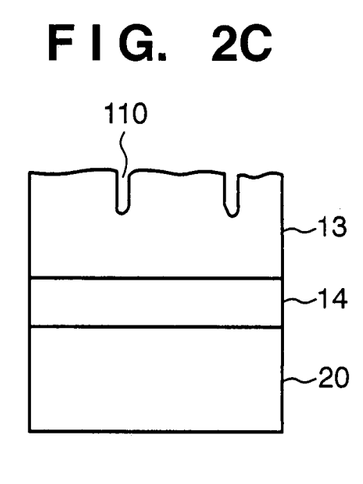

FIGS. 2A, 2B, and 2C are sectional views schematically showing partial substrates in the steps shown in FIGS. 1B, 1C, and 1F, respectively. It is found that anodizing a commercially available $p^+$-type Si substrate without annealing can cause the vicinity of the surface to have a structure shown in FIG. 2A. More specifically, if the porous Si layer 12 is formed by anodizing without annealing, it becomes a layer (to be referred to as a roughness layer hereinafter) 101 whose region from the surface to a depth of about 10 nm has a large number of recesses. A region at a depth of about 10 to 35 nm from the surface becomes a layer (to be referred to as a low-porosity layer hereinafter) 102 which has a small number of pores and a low porosity. A region at a depth of more than 35 nm from the surface becomes a layer (to be referred to as a standard porosity layer hereinafter) 103 which has more pores than the low-porosity layer 102 and a substantially uniform porosity. The porosity of the standard porosity layer 103 can be controlled by, e.g., the composition of the anodizing solution (e.g., an HF-containing solution), the amperage of a current supplied between the electrodes, and the like. Also, the porosity of the standard porosity layer 103 can be determined such that the porous Si layer 12 does not collapse before the division step but easily collapse in the division step by a force of, e.g., a fluid.

If the nonporous single-crystal Si layer 13 is epitaxially grown on the substrate having the roughness layer 101 and low-porosity layer 102, the recesses in the roughness layer 101 may be filled up, as shown in FIG. 2B. The pores in the low-porosity layer 102 may be filled partially, i.e., from the surface (interface with the roughness layer 101) of the low-porosity layer 102 to a depth of about several nm but is not filled completely. The silicon oxide insulating layer 14 is formed on this substrate (FIG. 1C), which is bonded to the second substrate (handle substrate) 20 to form the bonded substrate stack 30 (FIG. 1D). The bonded substrate stack 30 is divided into two (FIG. 1E), and the residual porous Si layer 12b on the surface is dissolved and removed by etching. As shown in FIG. 1C, recessed defects (some of them are pinholes) 110 remain in the surface and their depths depend on the thickness of the low-porosity layer 102. An example of an experimental result will be given. If the SOI layer 13 with a thickness of 20 nm was formed, about 20,000 recessed defects (including pinholes) were observed on a wafer having a diameter of 200 mm.

As described above, generation of the recessed defects (including pinholes) in the SOI layer is closely related to the presence of the low-porosity layer. One solution of forming an extra-thin (e.g., a thickness of 30 nm, or 20 nm or less) SOI layer while suppressing recessed defects to fall within a tolerance is to reduce, and more preferably, eliminate the low-porosity layer 102 in the vicinity of the porous Si layer 12 serving as an underlying layer of the semiconductor layer (single-crystal Si layer) 13 to be used as the SOI layer. Note that anodizing so as to increase the porosity of a portion corresponding to the low-porosity layer 102 will excessively increase the porosity of the standard porosity layer below the portion. This means that the low-porosity layer 102 may collapse before the division step.

In a region from the surface to a depth of about 5 nm, pores are filled up by the epitaxial growth step (FIG. 1C) of the nonporous single-crystal Si layer 13. Accordingly, the low porosity of this region does not induce recessed defects.

Investigation of the generation mechanism of a low-porosity layer is important in controlling the structure of the vicinity of the surface of the porous Si layer 12. Intensive study of the present inventors have resulted in successful determination of the low-porosity layer generation mechanism.

An Si substrate is typically subjected to polishing and alkali cleaning before anodizing. An alkaline solution and silicon react with each other to generate hydrogen in the following manner.

$$Si + 2OH^- \rightarrow SiO_2^- + 2H_2$$

Hydrogen is known to diffuse up to a depth of about 3 μm in the Si substrate during cleaning. Diffused hydrogen deactivates a dopant (e.g., boron serving as an acceptor of a $p^+$ wafer) and thus increase the resistivity in the vicinity of the Si substrate. If the substrate which has two layered regions with different resistivities is anodized with a constant current, a low-porosity layer is formed in a region of about several ten nm in thickness from the interface between the two regions with different resistivities to the higher resistivity side (i.e., the surface side of the substrate). This phenomenon may occur for the following reason. In anodizing, a plurality of pores grow in a high-resistivity region. When some of them reach a low-resistivity region ahead of the others, currents concentrate on the leading pores. As a result, only the leading pores grow while the others stop growing. This phenomenon has also been reported by other researchers (S. Frohnhoff et al., Thin Solid Films, 1995, 255, 59–62).

For the above-mentioned reason, it is important to perform anodizing after making the resistivity of the Si substrate substantially uniform in terms of depth in the vicinity (e.g., a region from the surface to a depth of about 100 nm) of the surface in forming porous silicon without a low-porosity layer. Porous silicon having a reduced low-porosity layer is considered as useful not only in the manufacture of an SOI substrate but also in other application fields.

The present inventors have confirmed that annealing at 200° C. for 20 min in clean air makes the resistivity of a p-type Si substrate substantially uniform in a direction of depth, and no low-porosity layer is formed in the resultant porous layer.

As for adverse effects produced by diffusion of hydrogen in a wafer and measures against them, several proposals have been made. These proposals are not intended to form a porous layer having a uniform structure. Japanese Patent Laid-Open No. 7-45573 discloses a method of outwardly diffusing hydrogen diffused by etching or the like, by annealing at 50 to 200° C. for 15 min to 24 hr in clean air. Japanese Patent Laid-Open No. 5-21371 discloses a method of outwardly diffusing hydrogen diffused by plasma, by annealing at 350 to 500° C. in an inert gas or vacuum.

The resistivity of an Si substrate in the direction of depth can be uniformed by annealing as described above. Annealing is desirably done in a non-reducing atmosphere to prevent outward diffusion of a dopant. For example, in addition to argon, nitrogen, helium, or the like generally used in the semiconductor manufacturing step as an inert gas, clean air or oxygen may be adopted. Especially if an Si substrate is annealed in an atmosphere containing oxygen, an oxide film is formed on the surface of the substrate, which prevents outward diffusion of a dopant. Prevention of outward diffusion is disclosed in Japanese Patent Laid-Open No. 8-306682. Since annealing in an atmosphere containing insufficient oxygen causes outward diffusion of a dopant, the annealing temperature is preferably less than 1,100° C.

Figure 11:
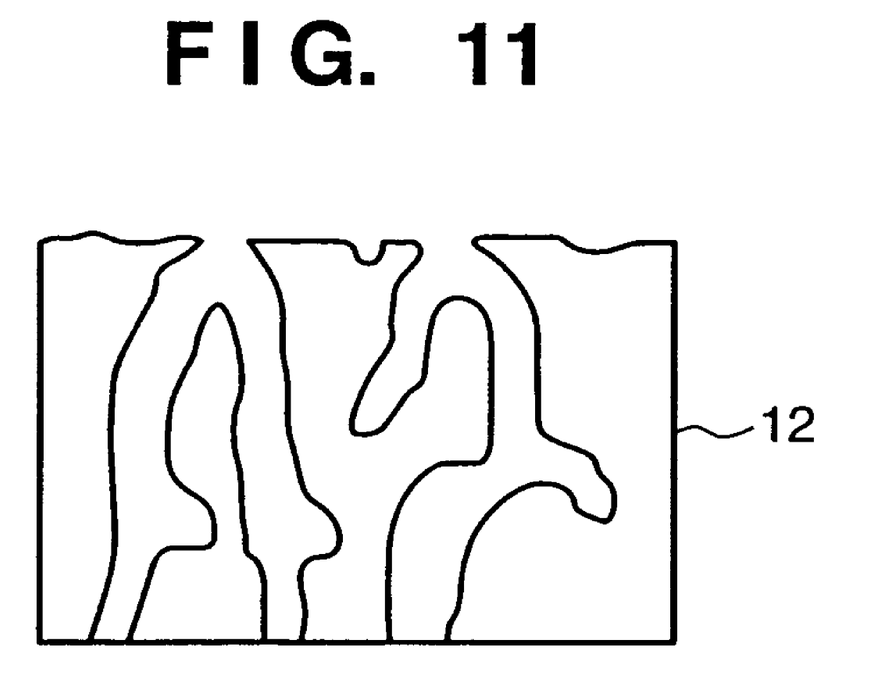
FIG. 11 is a schematic view showing the structure in the vicinity of the surface of a porous Si layer obtained by annealing and anodizing an Si wafer.

As described above, annealing the Si substrate 11 at 50° C. or more in oxygen or at 50° C. to 1,100° C. or less in a rare gas before anodizing suppresses generation of a low-porosity layer in the porous Si layer and makes it possible to manufacture an SOI substrate having a small number of recessed defects (including pinholes). FIG. 11 is a view schematically showing the structure of the vicinity of the surface of the porous Si layer 12 obtained by anodizing the Si substrate after annealing. As described above, annealing at 50° C. or more is disclosed in Japanese Patent Laid-Open No. 7-45573.

A reduction in a low-porosity layer in a porous Si layer can contribute to uniforming the thickness of an SOI layer to be formed. As shown in FIGS. 2A to 2C, the low-porosity layer 102 can constitute a part of the nonporous single-crystal Si layer 13 in forming the nonporous single-crystal Si layer 13 on the porous Si layer 12. For this reason, in-plane variations or variations between substrates in thickness of the low-porosity layer leads to variations in thickness of the nonporous single-crystal Si layer 13 and eventually leads to variations in thickness of the SOI layer. If an Si substrate purchased from a wafer manufacturer or the like is directly anodized without annealing, in-plane variations and variations between substrates occur in resistivity of the surface depending on the wafer manufacturer or processing state. This causes variations in thickness of the low-porosity layer in the porous layer to be formed, resulting in variations in thickness of the SOI layer. Hence, making the resistivity of the Si substrate 11 substantially uniform or adjusting it in the direction of depth by annealing or the like can contribute to reducing not only recessed defects but also variations in thickness of the SOI layer.

A material substrate on which the porous layer is to be formed is not limited to a p-type substrate. For example, in an n-type substrate as well, the structure of the porous layer to be formed can be controlled by adjusting or controlling the resistivity of the surface by annealing or the like. Also, the material substrate is not limited to a single-crystal Si substrate. The present invention can be applied to, e.g., a substrate made of a material other than silicon as well as a poly-Si substrate and an amorphous Si substrate. In performing annealing to adjust or control the resistivity distribution in the direction of depth of the material substrate, a gas used is not limited to an inert gas or oxygen.

EXAMPLES

Example 1

Figure 3:
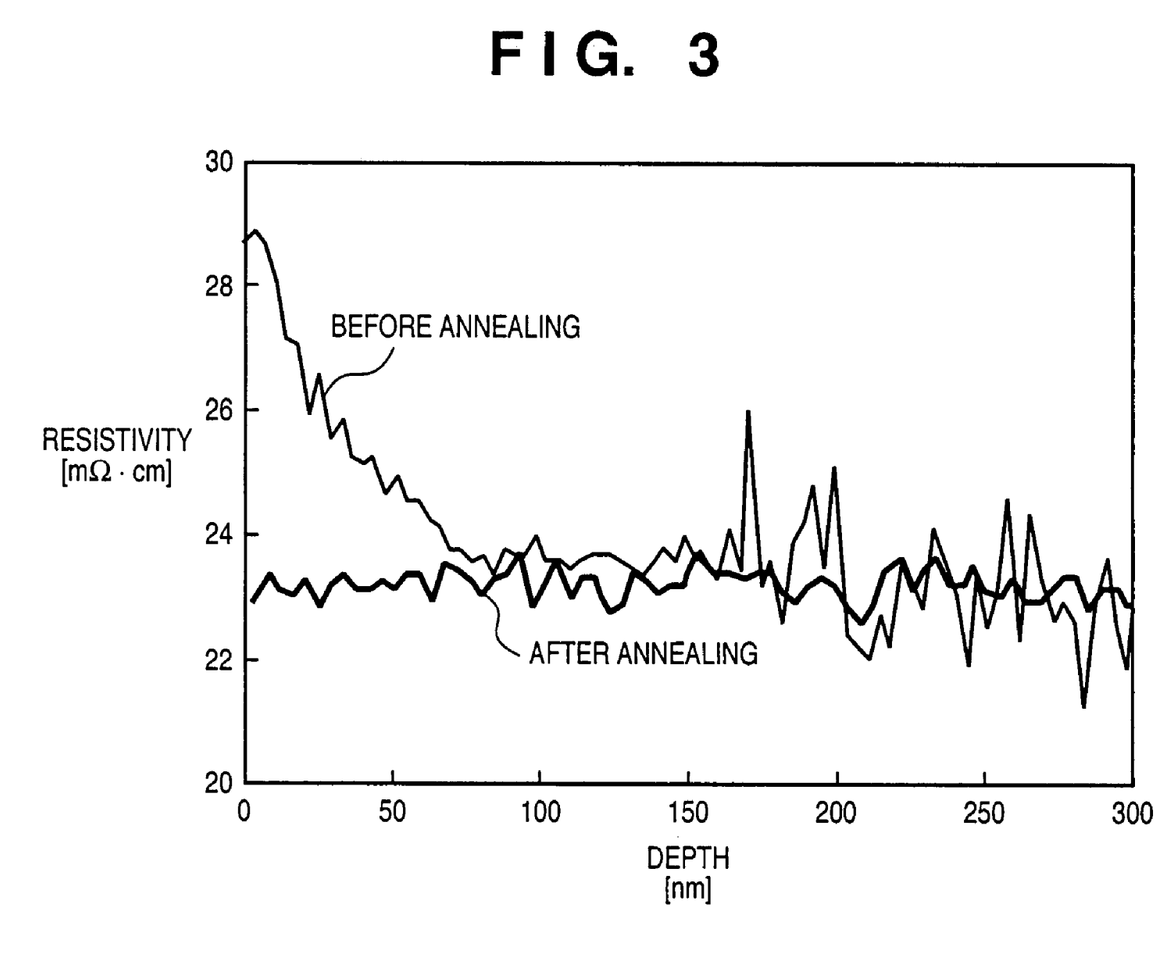
FIG. 3 is a graph showing the result of evaluating by SR measurement the dependences on the depth of resistivities obtained when annealing is performed and when annealing is not performed.
Figure 4A:
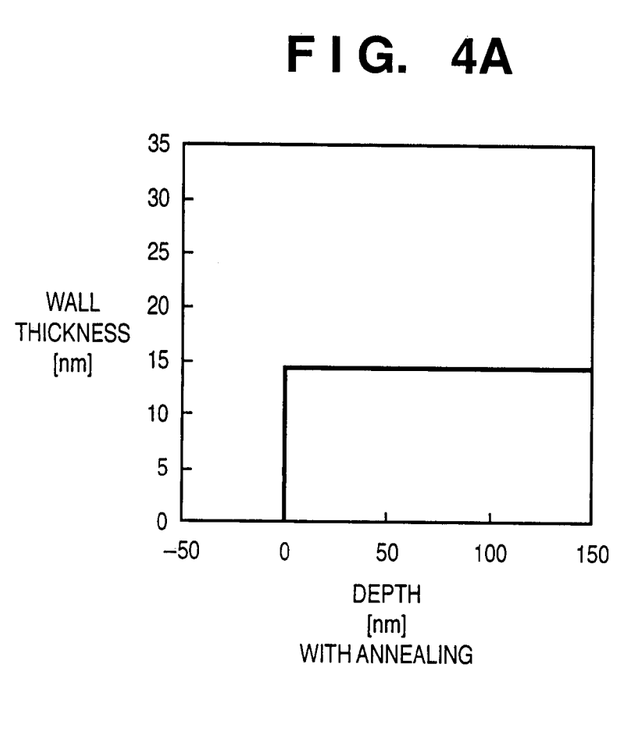
FIGS. 4A and 4B are graphs showing the dependences on the depth of the thicknesses of porous walls of porous silicon obtained when annealing is performed and when annealing is not performed.
Figure 4B:
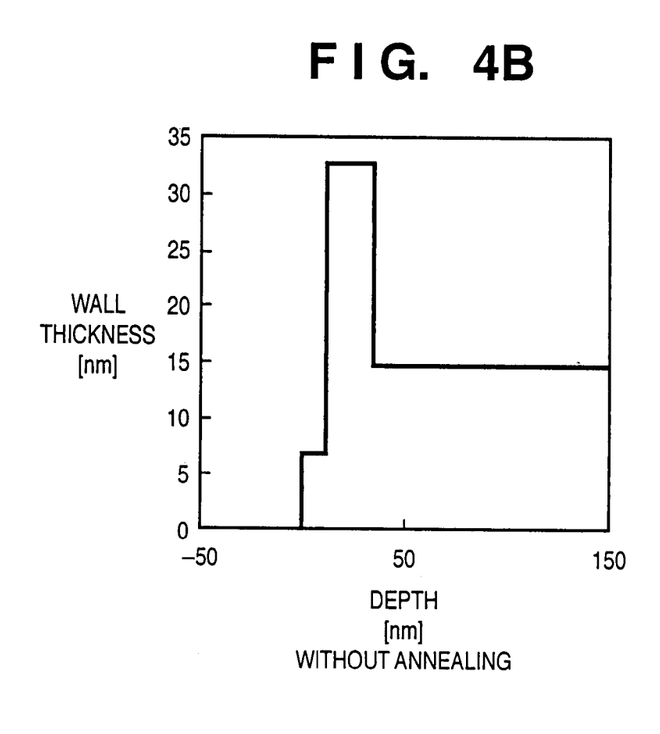
Figure 5A:
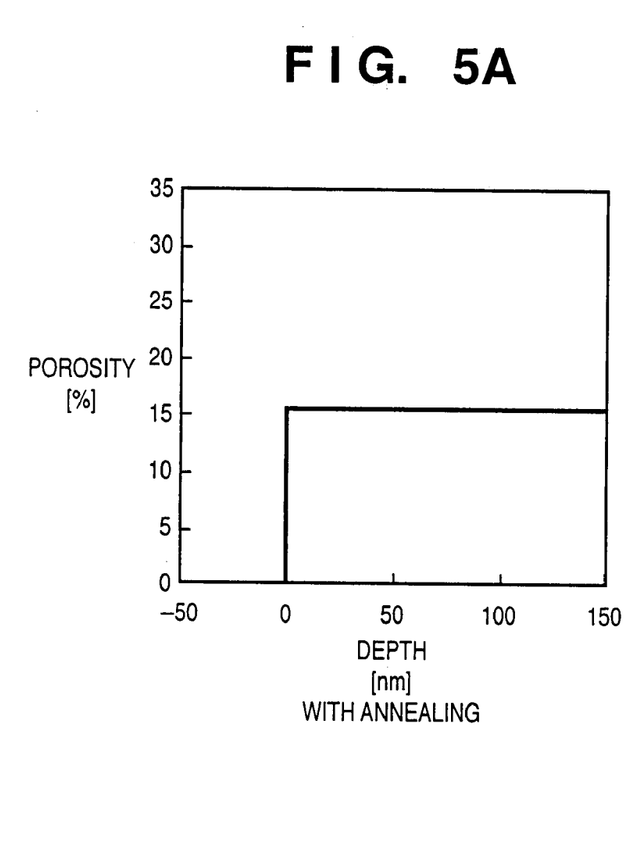
FIGS. 5A and 5B are graphs showing the dependences on the depth of the porosities of porous silicon obtained when annealing is performed and when annealing is not performed.
Figure 5B:
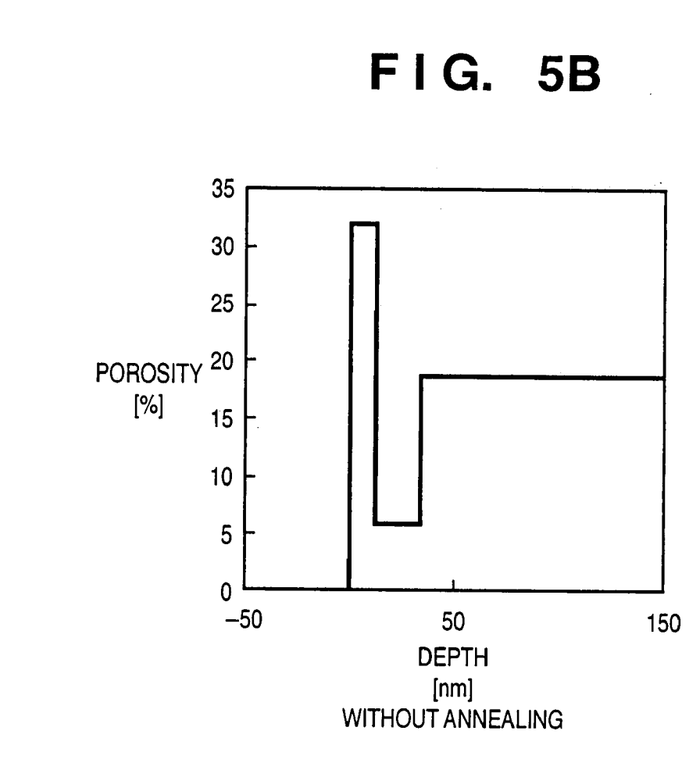
Figure 6A:
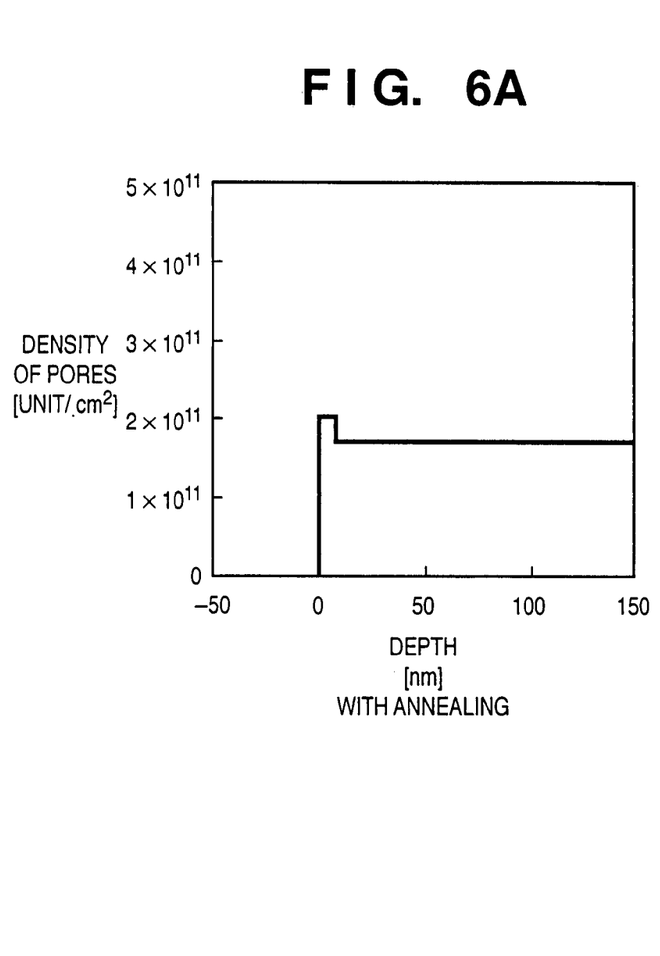
FIGS. 6A and 6B are graphs showing the dependences on the depth of the densities of pores of porous silicon obtained when annealing is performed and when annealing is not performed.
Figure 6B:
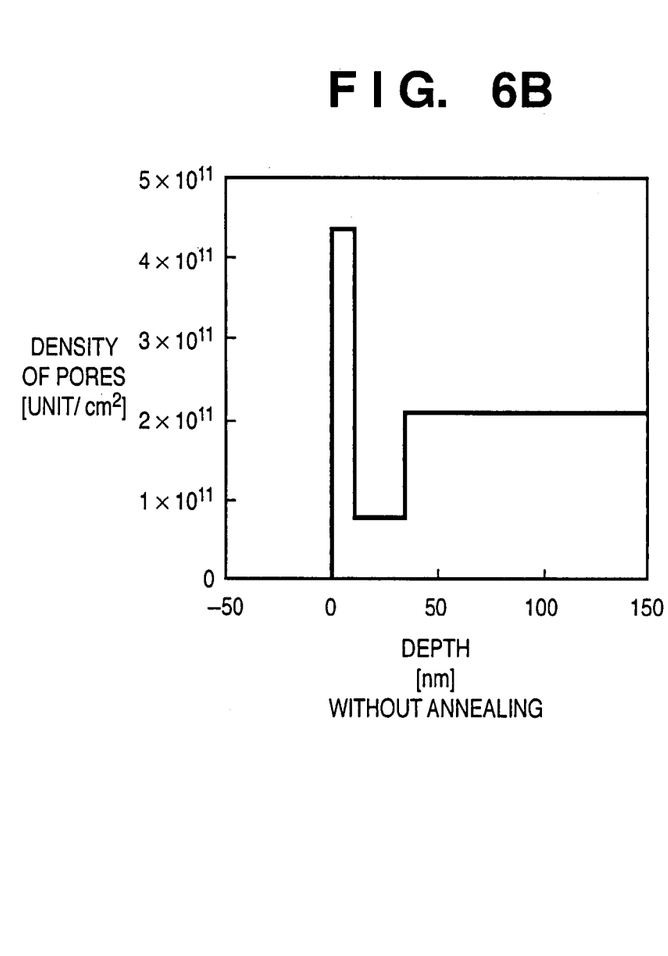

A p-type Si wafer of 15 mΩ·cm was annealed at 400° C. for 1 hr in an oxygen atmosphere and then anodized. FIG. 3 is a graph showing the result of evaluating by SR measurement the dependences on the depth of the resistivities obtained when annealing is performed and when annealing is not performed. Annealing decreases the resistivity in the vicinity (a region at a depth of 0 to 100 nm) of the surface of the Si wafer and makes the resistivity in a region at a depth of 0 to 300 nm substantially uniform. A region at a depth of 300 nm or more is also estimated to have a similar resistivity. FIGS. 4A, 4B, 5A, 5B, 6A, 6B, 9, and 10 are graphs and tables showing the dependences on the depth of the structure of porous silicon when annealing is performed and when annealing is not performed. These data were obtained by diagonally polishing the surface of the porous silicon formed on the Si wafer at an angle of 0.5° and then performing SEM observation from the surface. Anodizing after annealing makes the thickness (FIGS. 4A, 4B, 9, and 10) of a porous wall between pores, porosities (FIGS. 5A, 5B, 9, and 10), densities of pores (FIGS. 6A, 6B, 9, and 10), and mean value of pore sizes more uniform with respect to the direction of depth. They fall within a range much narrower than a tolerance required at present.

Note that in FIGS. 4A, 4B, 5A, 5B, 6A, 6B, 9, and 10, a pore size is the diameter of a circle obtained by converting the sectional area of a pore in a plane parallel to the surface of the Si wafer. In measurement for obtaining these data, the resolution (precision) in the direction of depth depends on the precision of the polishing angle, measurement precision, and the like, and is hard to measure at sufficiently high precision. The precision in the direction of depth was ensured by performing SEM observation from sections in addition to the measurement. The actually obtained precision in the direction of depth was about 2 nm. The porous wall thickness and the pore size depend on the resolution of an SEM and their values can be measured at a precision of about 1 nm. When measurement is performed a large number of times to obtain a mean value, about 0.1 nm can be a significant difference. The density of pores represents the number of pores in a predetermined visual field and can be measured at sufficiently high precision. The porosity represents the total sectional area of pores per unit area, and the precision of the porosity also depends on the resolution of the SEM. The porosity is obtained by measuring a large number of pores and can be measured at relatively high precision.

As can be seen from the FIGS. 4A, 4B, 5A, 5B, 6A, 6B, 9, and 10, the thickness of a porous wall in the porous layer, density of pores, and porosity are substantially uniform at least in a region at a depth of 0 to 150 nm from the surface. In a region from the surface to a depth of 5 nm out of this region, pores in a porous Si layer are filled up in forming a nonporous Si layer on the porous Si layer. The porous structure in the region from the surface to the depth of 5 nm does not require consideration in terms of a reduction in recessed defects which may occur in the SOI layer. A region at a depth of 100 nm or more from the surface is a region (i.e., a region which is not affected by high resistivity in the vicinity of the surface) which does not become a low-porosity layer unless the anodizing conditions are changed during anodizing. The region has a porous structure coincident with the target structure and is uniform. Noteworthy among the experimental results is the fact that the porous structure (this is quantified as parameters such as the thickness of a porous wall in the porous layer and/or density of pores and/or porosity) in a region at a depth of 5 to 100 nm from the surface is substantially uniform and that the porous structure in the region is substantially equal to that at a depth of 100 nm or more from the surface of the porous Si layer.

The above-mentioned experimental results were obtained by uniforming the resistivity in the vicinity of the surface of the Si substrate on which the porous layer is to be formed at high precision in the direction of depth, as shown in FIG. 3.

However, the uniformity in porous structure of the porous Si layer only needs to be obtained within a range which satisfies the requirements for an application using the porous Si layer.

If each of parameters such as the thickness of a porous wall in the porous layer and/or density of pores and/or porosity in a region at a depth of 5 to 100 nm from the surface of the porous Si layer is half to twice the reference value, the porous Si layer exhibits an effect more excellent than a porous Si layer obtained by anodizing the Si substrate without annealing. The term "substantially" used to describe the uniformity of the porous structure, porous wall thickness, density of pores, porosity, and the like allows a value half to twice each reference value. To value not the productivity or cost efficiency but technical effects, the uniformity is desirably high. For example, as demands for a decrease in thickness and an increase in surface planarity of an SOI layer grow, the uniformity of a porous structure must be increased. In the future, uniformity defined by a narrower tolerance such as 0.75 to 1.25 times, 0.8 to 1.2 times, or 0.9 to 1.1 times each reference value can be adopted.

The above-mentioned reference values can be set to be equal to the values of parameters such as the thickness of a porous wall of the porous layer, and density of pores at an arbitrary depth of 100 nm or more (e.g., a depth of 100 nm, 150 nm, or the like) from the surface of the porous Si layer.

Figure 8:
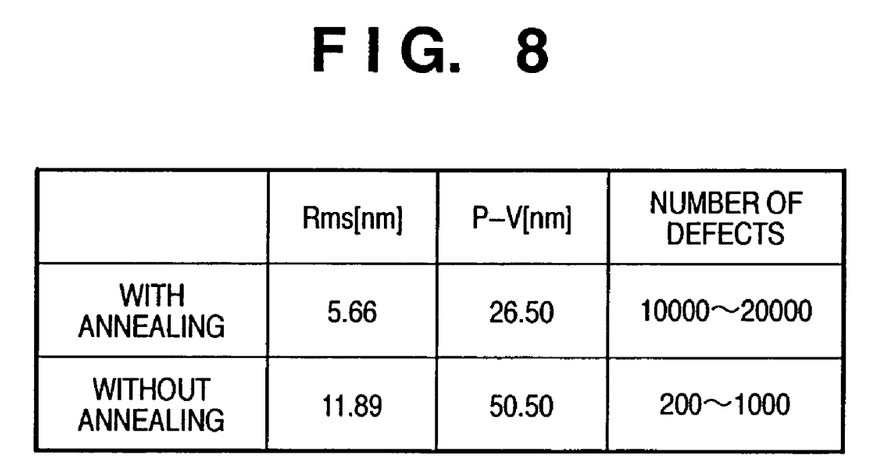
FIG. 8 is a table showing the surface roughnesses of SOI substrates obtained when annealing is performed and when annealing is not performed, which have undergone removal by etching of residual porous silicon after the division step.
Figure 9:
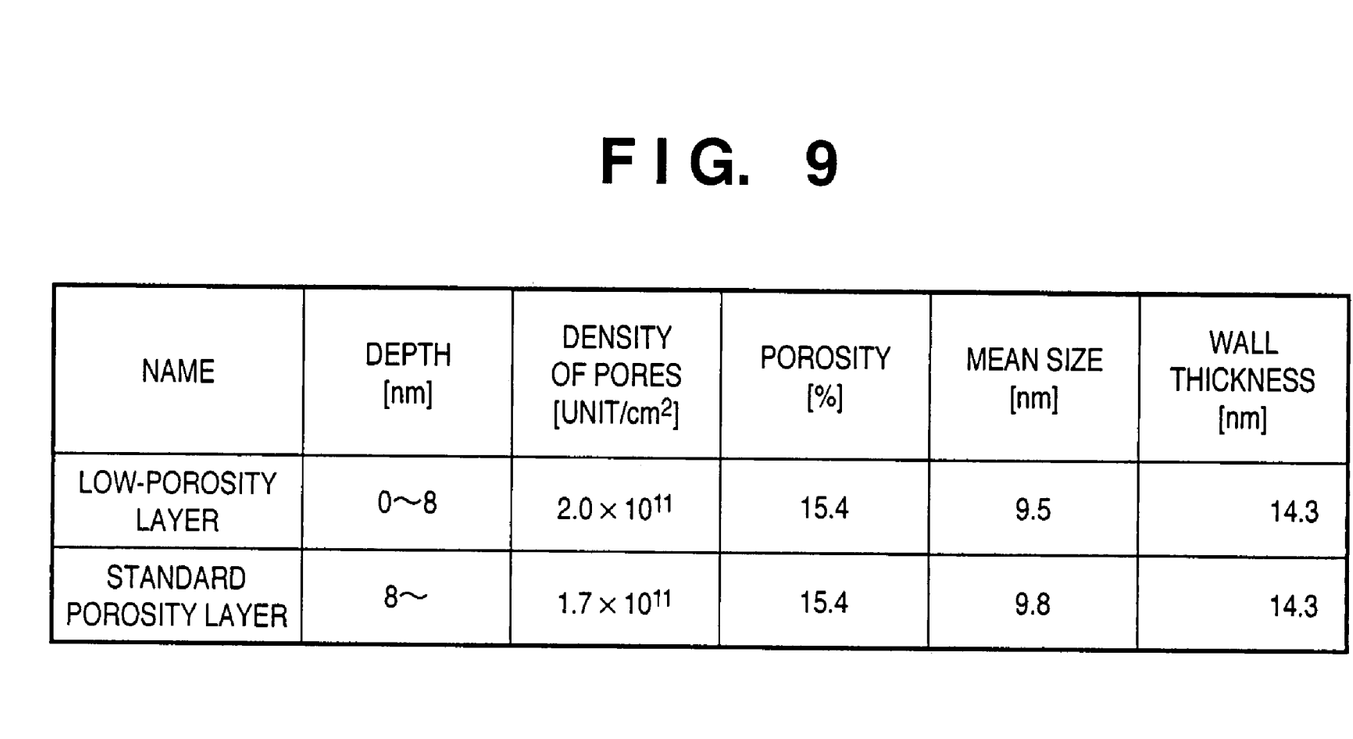
FIG. 9 is a table showing the dependence on the depth of the structure of porous silicon when annealing is performed.
Figure 10:
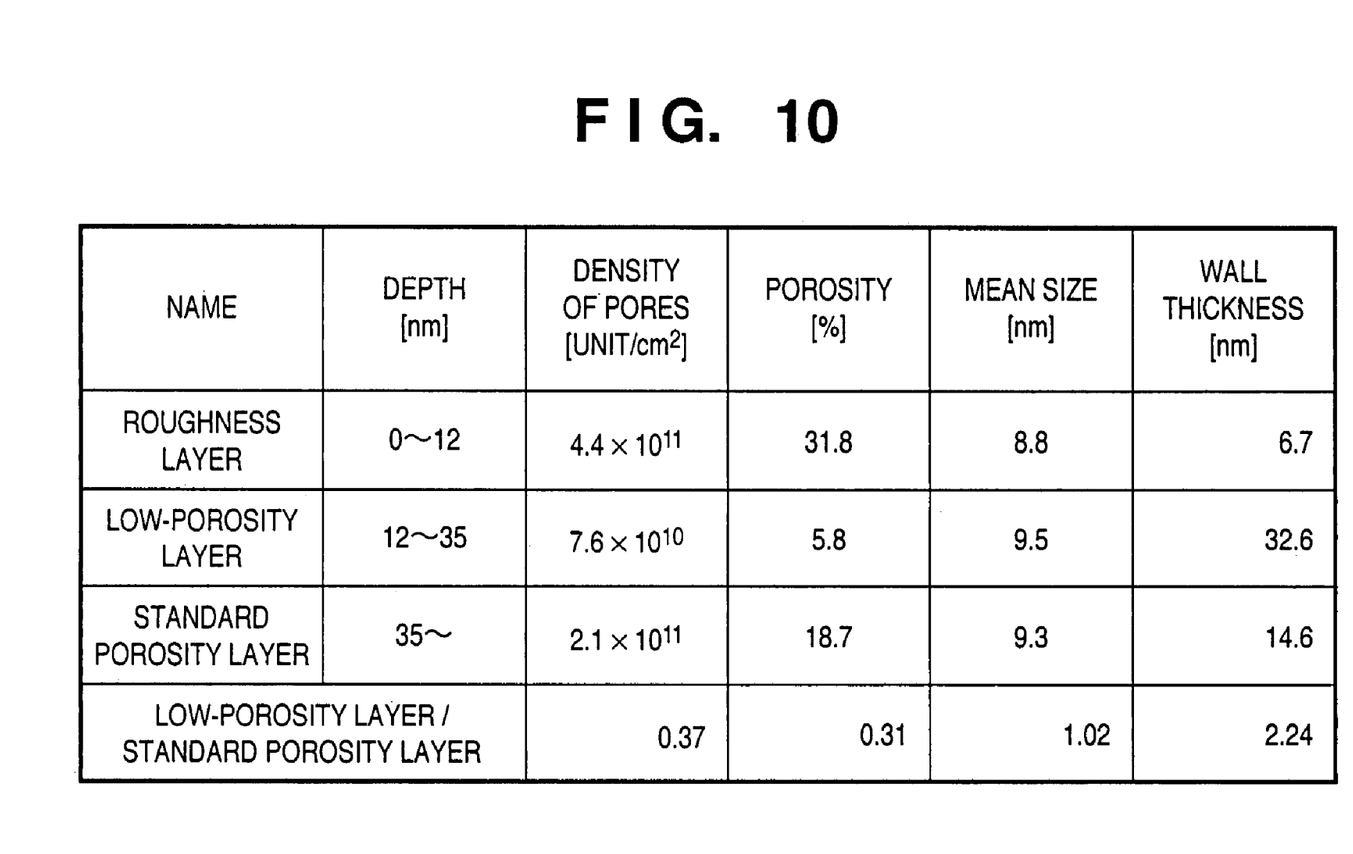
FIG. 10 is a table showing the dependence on the depth of the structure of porous silicon when annealing is not performed.

FIG. 8 is a table showing the roughness of the SOI substrate having undergone removal by etching of residual porous silicon after the division step. By annealing the Si substrate serving as the material substrate before forming the porous Si layer, each of the Rms value and P-V value decreases to about a half. The Si substrate was annealed before anodizing in manufacturing an SOI substrate having an SOI layer with a thickness of 20 nm. The number of recessed defects including pinholes decreased to one-tenth to one-hundredth, compared to a case without annealing.

Figure 7A:
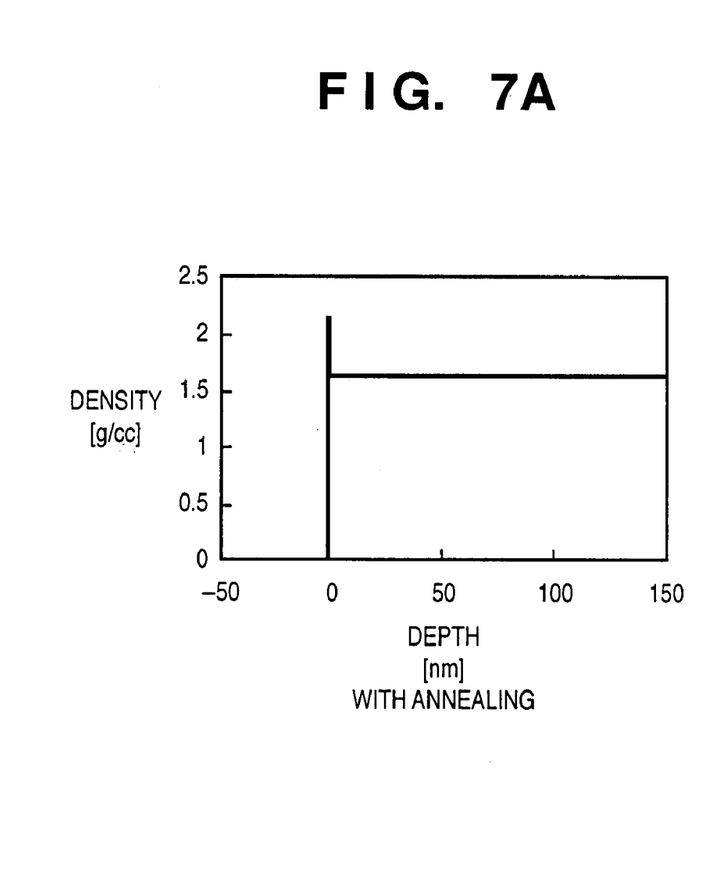
FIGS. 7A and 7B are graphs showing the dependences on the depth of the densities of porous silicon obtained when annealing is performed and when annealing is not performed.
Figure 7B:
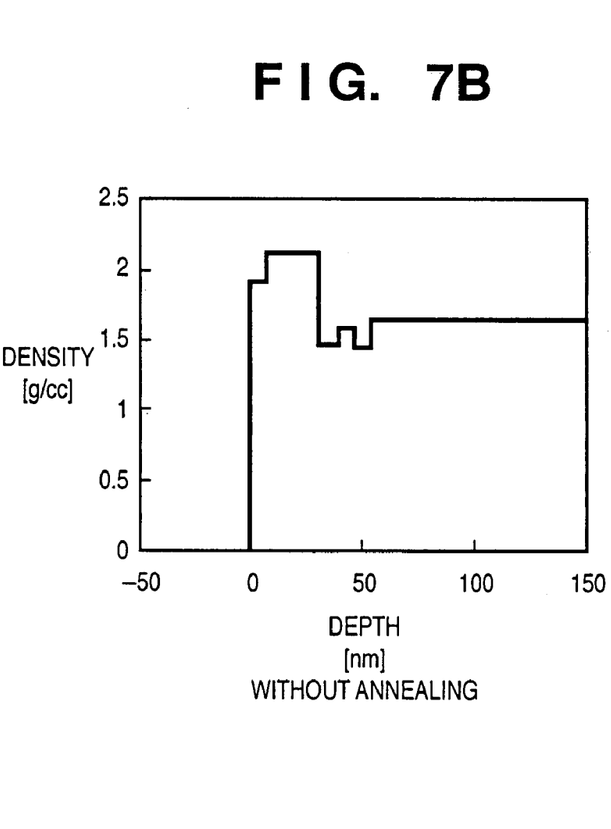

FIGS. 7A and 7B show results of evaluating and comparing by X-ray reflectance (XRR) measurement the densities (g/cc) of porous silicon when annealing was performed and when annealing was not performed. When annealing was not performed, a high-density region, i.e., a low-porosity layer was observed at a depth of 5 nm to 30 nm. When annealing was performed, a low-porosity layer was present only near a depth of 7.7 Å from the surface.

Example 2

A p-type Si wafer of 15 mΩ·cm was annealed at 150° C. for 30 min in a nitrogen atmosphere and then anodized. By performing annealing, the thickness of a low-porosity layer decreased to a half that of a case without annealing. The number of defects including pinholes in a manufactured SOI substrate decreased to about a half.

Example 3

A p-type Si wafer of 15 mΩ·cm was annealed at 900° C. for 1 hr in an oxygen atmosphere and then anodized. By performing annealing, the thickness of a low-porosity layer became 1 nm or less, and the number of defects including pinholes in a manufactured SOI substrate decreased to one-tenth to one-hundredth that of a case without annealing.

Example 4

A conventional manufacturing method may often cause defects. More specifically, in-plane variations of 10 nm or more may occur in the SOI thickness due to variations in resistivity in the vicinity of a wafer purchased from a wafer manufacturer. By anodizing after annealing a wafer at 400° C. for 1 hr in an oxygen atmosphere, variations in thickness of the resultant SOI layer became 2 nm or less.

Example 5

A gas adsorption sensor can be manufactured using porous silicon without a low-porosity layer. When an Si wafer was anodized while the resistivity in the vicinity of the Si wafer is nonuniform, each pore in a low-porosity layer converged, and the conductance decreased. According to the present invention, by uniforming the resistivity in the vicinity of the surface of an Si wafer and then anodizing the Si wafer, entrance and exit of gas with respect to pores can be facilitated, and the conductance can be increased.

Example 6

A biosubstrate can be manufactured using porous silicon without a low-porosity layer. When an Si wafer is anodized while the resistivity in the vicinity of the Si wafer is nonuniform, each pore converges on the surface, thereby resulting in insufficient utilization of porosity. Also, it is difficult to perform cleaning, and hydrofluoric acid derived from an anodizing solution remains, which may destroy proteins and DNA. According to the present invention, by uniforming the resistivity in the vicinity of the surface of an Si wafer and then anodizing the Si wafer, the convergence of pores can be prevented. Also, hydrofluoric acid hardly remains, and the resultant substrate can readily be utilized as a biosubstrate.

Example 7

An MEMS can be manufactured using porous silicon without a low-porosity layer. When an Si wafer is anodized while the resistivity in the vicinity of the Si wafer is nonuniform, a thin film is formed on the surface, and thus the Si wafer is not uniform as a material. For example, only a low-porosity layer may peel off during etching and serve as a foreign substance. This may cause operation errors. According to the present invention, by uniforming the resistivity in the vicinity of the surface of an Si wafer and then anodizing the Si wafer, an MEMS material uniform in thickness can be provided.

Example 8

A liquid junction solar cell (Graetzel cell) can be manufactured using porous silicon without a low-porosity layer. When an Si wafer is anodized while the resistivity in the vicinity of the Si wafer is nonuniform, each pore in a low-porosity layer converges. For this reason, the solution displacement efficiency, light absorption efficiency, and coloring agent introduction efficiency are low. According to the present invention, by uniforming the resistivity in the vicinity of the surface of an Si wafer and then anodizing the Si wafer, entrance and exit of light or coloring agents with respect to pores can be facilitated.

As can be seen from the above description, this specification focuses attention on the uniformity of or a change in a porous structure in the direction of depth, which can be evaluated at a high resolution (high evaluation standard) of, e.g., not more than several nm or several ten nm. The specification has a viewpoint totally different from that of a technique that pertains to uniformity of several or several ten am or more. More specifically, evaluation of uniformity at a relatively low resolution does not indicate uniformity in a technique as disclosed in the specification.

According to an aspect of the present invention, a porous structure with high uniformity can be obtained even when evaluated at a high resolution (high evaluation standard) of several or several ten nm or more.

According to another aspect of the present invention, by using a porous structure with high uniformity, a high-quality member (e.g., an SOI substrate) can be manufactured.

As many apparently widely different embodiments of the present invention can be made without departing from the spirit and scope thereof, it is to be understood that the invention is not limited to the specific embodiments thereof except as defined in the appended claims.

What is claimed is:

1. A member which includes a porous region,
    wherein in a region at a depth within a range from 5 to 100 nm from a surface of the porous region made of silicon, a thickness of a porous wall between pores, a density of pores, and a porosity are substantially uniform.

2. A member which includes a porous region,
    wherein in a region at a depth within a range from 5 to 100 nm from a surface of the porous region made of silicon, a thickness of a porous wall between pores, a density of pores, and a porosity vary to have values half to twice corresponding reference values.

3. A member which includes a porous region,
    wherein if evaluation is performed at an arbitrary depth within a range from 5 to 100 nm from a surface of the porous region, a mean of thicknesses of porous walls between pores at a predetermined depth within the range is half to twice a mean of thicknesses of porous walls between pores at a depth of not less than 100 nm from the surface of the porous region.

4. A member which includes a porous region,
    wherein if evaluation is performed at an arbitrary depth within a range from 5 to 100 nm from a surface of the porous region, a porosity at a predetermined depth within the range is half to twice a porosity at a depth of not less than 100 nm from the surface of the porous region.

5. A member which includes a porous region,
    wherein if evaluation is performed at an arbitrary depth within a range from 5 to 100 nm from a surface of the porous region, a density of pores at a predetermined depth within the range is half to twice a density of pores at a depth of not less than 100 nm from the surface of the porous region.

6. The member according to any one of claims 1 to 5, wherein the porous region contains silicon.

* * * * *